(12) United States Patent
Inubushi et al.

(10) Patent No.: US 12,040,115 B1
(45) Date of Patent: Jul. 16, 2024

(54) MAGNETORESISTANCE EFFECT ELEMENT

(71) Applicant: TDK CORPORATION, Tokyo (JP)

(72) Inventors: Kazuumi Inubushi, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/106,683

(22) Filed: Feb. 7, 2023

(51) Int. Cl.
*H01F 10/32* (2006.01)
*G01R 33/09* (2006.01)
*H10N 52/85* (2023.01)
*G11B 5/39* (2006.01)
*H03H 1/00* (2006.01)
(Continued)

(52) U.S. Cl.
CPC ......... *H01F 10/329* (2013.01); *G01R 33/091* (2013.01); *G01R 33/093* (2013.01); *G01R 33/098* (2013.01); *G11B 5/39* (2013.01); *G11B 2005/3996* (2013.01); *H03H 2001/0057* (2013.01); *H03H 7/06* (2013.01); *H10B 61/00* (2023.02); *H10N 52/85* (2023.02)

(58) Field of Classification Search
None
See application file for complete search history.

(56) References Cited

U.S. PATENT DOCUMENTS 7,252,852 B1 * 8/2007 Parkin ................ H01F 10/3254
428/811.1
7,598,555 B1 * 10/2009 Papworth Parkin ... H10N 50/01
365/158
(Continued)

FOREIGN PATENT DOCUMENTS

| JP | 2012-190914 A | 10/2012 |
|----|---------------|---------|
| JP | 6137577 B2 | 5/2017 |
| JP | 2017-103419 A | 6/2017 |

OTHER PUBLICATIONS

Young-suk Choi et al., "Enhancement of current-perpendicular-to-plane giant magnetoresistance by insertion of amorphous ferromagnetic underlayer in Heusler alloy-based spin-valve structures", Applied Physics Express 10, (2017), pp. 013006-1-013006-4.
(Continued)

*Primary Examiner* — Kevin M Bernatz
(74) *Attorney, Agent, or Firm* — Oliff PLC (57) ABSTRACT

This magnetoresistance effect element includes a first ferromagnetic layer, a second ferromagnetic layer, and a non-magnetic layer. The non-magnetic layer is between the first ferromagnetic layer and the second ferromagnetic layer. The first ferromagnetic layer contains at least partially crystallized Heusler alloy containing Co. The non-magnetic layer has a first non-magnetic region and a second non-magnetic region. Each of the second non-magnetic region is sandwiched between the first non-magnetic regions in a thickness direction of the non-magnetic layer. Atoms or molecules constituting each of the second non-magnetic regions are smaller than atoms or molecules constituting the first non-magnetic region. Each crystal structure of the second non-magnetic region is a NaCl type structure. At least a part of the second non-magnetic region is crystallized continuously with the first non-magnetic region and the first ferromagnetic layer or the second ferromagnetic layer.

15 Claims, 9 Drawing Sheets

(51) Int. Cl.
*H03H 7/06* (2006.01)
*H10B 61/00* (2023.01)

(56) References Cited

U.S. PATENT DOCUMENTS

| | | | | |
|---|---|---|---|---|
| 7,920,361 | B2* | 4/2011 | Yoshikawa | H01F 10/3254 |
| | | | | 360/324.1 |
| 8,379,351 | B2* | 2/2013 | Fuji | B82Y 10/00 |
| | | | | 360/324.11 |
| 8,551,626 | B2* | 10/2013 | He | B82Y 25/00 |
| | | | | 365/158 |
| 8,649,127 | B2* | 2/2014 | Fuji | G01R 33/098 |
| | | | | 360/322 |
| 8,685,491 | B2* | 4/2014 | Takeo | B82Y 40/00 |
| | | | | 427/128 |
| 8,953,282 | B2* | 2/2015 | Shiroishi | G11B 5/3967 |
| | | | | 360/110 |
| 9,666,794 | B2* | 5/2017 | Voznyuk | H10N 50/01 |
| 10,263,182 | B2* | 4/2019 | Sasaki | H10N 50/85 |
| 10,388,854 | B2* | 8/2019 | Yoshikawa | H10N 50/85 |
| 10,388,856 | B2* | 8/2019 | Sasaki | H10N 50/85 |
| 10,454,022 | B2* | 10/2019 | Sasaki | H10N 50/80 |
| 10,580,974 | B2* | 3/2020 | Sasaki | G11C 11/161 |
| 10,622,132 | B2* | 4/2020 | Manipatruni | H10N 50/85 |
| 10,755,733 | B1* | 8/2020 | Zheng | G11B 5/3929 |
| 10,908,234 | B2* | 2/2021 | Sasaki | G01R 33/096 |
| 10,921,392 | B2* | 2/2021 | Inubushi | H01F 10/30 |
| 11,056,593 | B2* | 7/2021 | Manipatruni | H01L 29/785 |
| 11,088,319 | B2* | 8/2021 | Kim | G11C 11/1659 |
| 11,665,979 | B2* | 5/2023 | Jeong | H10N 50/10 |
| | | | | 257/427 |
| 2016/0019917 | A1 | 1/2016 | Du et al. | |
| 2017/0229643 | A1 | 8/2017 | Chen et al. | |

OTHER PUBLICATIONS

Hari S. Goripati et al., "Bi-quadratic interlayer exchange coupling in Co2MnSi/Ag/Co2MnSi pseudo spin-valve", Journal of Applied Physics 110, (2011), pp. 123914-1-123914-7.

T. Furubayashi et al., "Structure and transport properties of current-perpendicular-to-plane spin valves using Co2FeAl0.5Si0.5 and Co2MnSi Heusler alloy electrodes", Journal of Applied Physics 107, (2010), pp. 113917-1- 113917-7.

* cited by examiner

MAGNETORESISTANCE EFFECT ELEMENT

BACKGROUND

The present disclosure relates to a magnetoresistance effect element.

The magnetoresistance effect element is an element of which a resistance value in a laminating direction changes due to a magnetoresistance effect. The magnetoresistance effect element includes two ferromagnetic layer and a non-magnetic layer sandwiched therebetween. The magnetoresistance effect element using a conductor for the non-magnetic layer is called a giant magnetoresistance (GMR) element and the magnetoresistance effect element using an insulating layer (tunnel barrier layer, barrier layer) for the non-magnetic layer is called a tunnel magnetoresistance (TMR) element. The magnetoresistance effect element can be applied to various applications such as magnetic sensor, high-frequency element, magnetic head, and nonvolatile random access memory (MRAM).

Non-Patent Document 1 (Young-suk et. al., Applied Physics Express 10, 013006 (2017)) describes a magnetic sensor equipped with a magnetoresistance effect element using a Heusler alloy for a ferromagnetic layer. The Heusler alloy has high spin polarization. The magnetic sensor containing the Heusler alloy is expected to have a large output signal. On the other hand, crystallization of Heusler alloys is necessary to realize the expected properties. Non-Patent Document 1 discloses that the Heusler alloy can be crystallized by low-temperature annealing by depositing an amorphous Heusler alloy film on an amorphous underlying layer.

SUMMARY

The magnetoresistance effect element is required to have an improved MR ratio which is the ratio of the maximum resistance to the minimum resistance.

This magnetoresistance effect element includes a first ferromagnetic layer, a second ferromagnetic layer, and a non-magnetic layer. The non-magnetic layer is between the first ferromagnetic layer and the second ferromagnetic layer. The first ferromagnetic layer contains at least partially crystallized Heusler alloy containing Co. The non-magnetic layer has a first non-magnetic region and a second non-magnetic region. Each of the second non-magnetic regions is sandwiched between the first non-magnetic regions in a thickness direction of the non-magnetic layer. Atoms or molecules constituting each of the second non-magnetic regions are smaller than atoms or molecules constituting the first non-magnetic region. Each crystal structure of the second non-magnetic region is a NaCl type structure. At least a part of the second non-magnetic region is crystallized continuously with the first non-magnetic region and the first ferromagnetic layer or the second ferromagnetic layer.

DETAILED DESCRIPTION

Hereinafter, this embodiment will be described in detail by appropriately referring to the drawings. In the drawings used in the following description, there are cases in which the feature portions are enlarged for the sake of convenience and the dimensional ratios and the like of each element may differ from the actual ones in order to easily understand the features of this embodiment. The materials, dimensions, and the like exemplified in the following description are examples, and the present disclosure is not limited to them and can be implemented with appropriate modifications without changing the gist of the present disclosure.

First Embodiment

Figure 1:
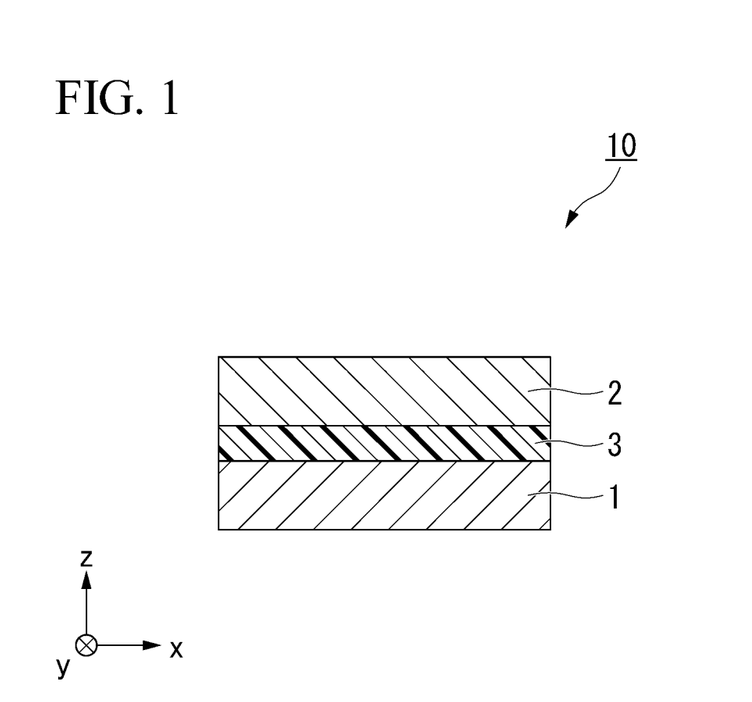
FIG. 1 is a cross-sectional view of a magnetoresistance effect element according to a first embodiment.

FIG. 1 is a cross-sectional view of a magnetoresistance effect element according to a first embodiment. First, directions will be defined. The thickness direction of each layer may be referred to as the z direction. Further, a direction that intersects a z direction and in which each layer extends is called an in-plane direction, one direction thereof is called an x direction, and a direction orthogonal to the x direction and z direction is called a y direction.

A magnetoresistance effect element 10 includes a first ferromagnetic layer 1, a second ferromagnetic layer 2, and a non-magnetic layer 3.

The magnetoresistance effect element 10 outputs a change in the relative angle between the magnetization of the first ferromagnetic layer 1 and the magnetization of the second ferromagnetic layer 2 as a change in resistance value. For example, the magnetization of the second ferromagnetic layer 2 is more mobile than the magnetization of the first ferromagnetic layer 1. When a predetermined external force is applied, the magnetization direction of the first ferromagnetic layer 1 does not change (is fixed), and the magnetization direction of the second ferromagnetic layer 2 changes. As the magnetization direction of the second ferromagnetic layer 2 changes with respect to the magnetization direction of the first ferromagnetic layer 1, the resistance value of the magnetoresistance effect element 10 changes. In this case, the first ferromagnetic layer 1 may be called a magnetization fixed layer, and the second ferromagnetic layer 2 may be called a magnetization free layer. Hereinafter, although it is described that the first ferromagnetic layer 1 is the magnetization fixed layer and the second ferromagnetic layer 2 is the magnetization free layer, this relationship may be reversed.

The difference in mobility between the magnetization of the first ferromagnetic layer 1 and the magnetization of the second ferromagnetic layer 2 when a predetermined external force is applied is caused by the difference in coercive force between the first ferromagnetic layer 1 and the second ferromagnetic layer 2. For example, when the thickness of the second ferromagnetic layer 2 is thinner than the thickness of the first ferromagnetic layer 1, the coercive force of the second ferromagnetic layer 2 is often smaller than the coercive force of the first ferromagnetic layer 1. Further, for example, an antiferromagnetic layer may be disposed on the surface of the first ferromagnetic layer 1 opposite to the non-magnetic layer 3 with a spacer layer sandwiched therebetween. The first ferromagnetic layer 1, the spacer layer, and the antiferromagnetic layer form a synthetic antiferromagnetic structure (SAF structure). The synthetic antiferromagnetic structure consists of two magnetic layers sandwiching the spacer layer. When the first ferromagnetic layer 1 and the antiferromagnetic layer are antiferromagnetically coupled, the coercive force of the first ferromagnetic layer 1 is larger than that in the case without the antiferromagnetic layer and the antiferromagnetic coupling. The antiferromagnetic layer is, for example, IrMn, PtMn, or the like. The spacer layer contains, for example, at least one selected from the group consisting of Ru, Ir, and Rh.

The first ferromagnetic layer 1 contains, for example, a Heusler alloy containing Co. The Heusler alloy is at least partially crystallized. The Heusler alloy may, for example, be wholly crystallized.

Whether or not the Heusler alloy is crystallized can be determined by a transmission electron microscope (TEM) image (for example, a high-angle scattering annular dark field scanning transmission microscope image: HAADF-STEM image) or an electron beam diffraction image using a transmission electron beam. If the Heusler alloy is crystallized, it can be confirmed that the atoms are arranged regularly in the HAADF-STEM image, for example. More specifically, spots derived from the crystal structure of the Heusler alloy appear in the Fourier transform image of the HAADF-STEM image. Further, when the Heusler alloy is crystallized, diffraction spots from at least one of the (001) plane, (002) plane, (110) plane, (111) plane, and (011) plane can be confirmed in the electron beam diffraction image. When crystallization can be confirmed by at least one means, it can be said that at least a part of the Heusler alloy is crystallized.

The Heusler alloy has, for example, a main orientation (or preferred orientation) in the (001) or (011) direction. Main orientation in the (001) or (011) direction means that the main crystallization direction of the crystals constituting the Heusler alloy is the (001) or (011) direction. For example, when the Heusler alloy consists of multiple crystal grains, the crystallization direction of each crystal grain may be different. In this case, when the direction of the synthetic vector of the crystal orientation directions in arbitrary 50 crystal grains is within a range of inclination of 25° or less with respect to the (001) direction, it can be said that the main orientation is in the (001) direction. The same applies to the (011) direction. The Heusler alloy in which the orientation directions of the constituent crystals are aligned has high crystallinity, and the MR ratio of the magnetoresistance effect element 10 containing this Heusler alloy is high. Further, the orientation direction that is considered to be equivalent to the (001) direction is also included in the (001) orientation. That is, the (001) orientation includes (001) orientation, (010) orientation, (100) orientation, and all orientation directions opposite thereto.

The Heusler alloys are intermetallic compounds with a chemical composition of XYZ or $X_2YZ$. The ferromagnetic Heusler alloy denoted by $X_2YZ$ is called a full Heusler alloy, and the ferromagnetic Heusler alloy denoted by XYZ is called a half-Heusler alloy. The half-Heusler alloy is the full-Heusler alloy in which some of the X-site atoms are vacant.

Figure 2A:
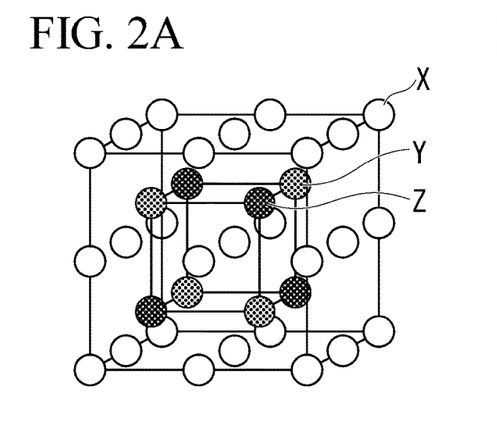
FIG. 2A is a diagram showing a crystal structure of a Heusler alloy.
Figure 2B:
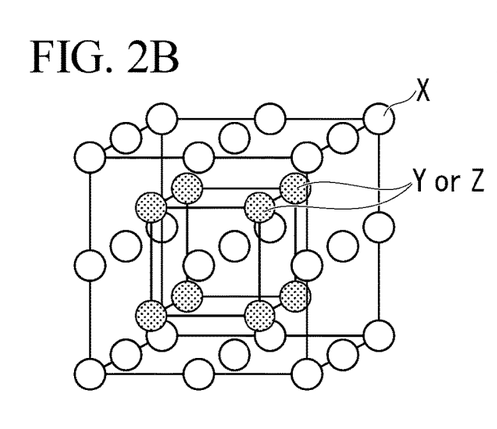
FIG. 2B is a diagram showing a crystal structure of a Heusler alloy.
Figure 2C:
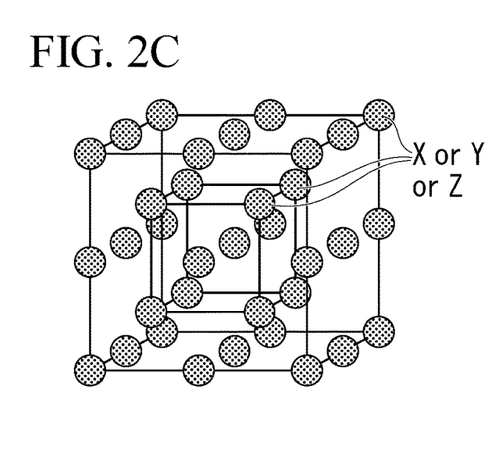
FIG. 2C is a diagram showing a crystal structure of a Heusler alloy.
Figure 2D:
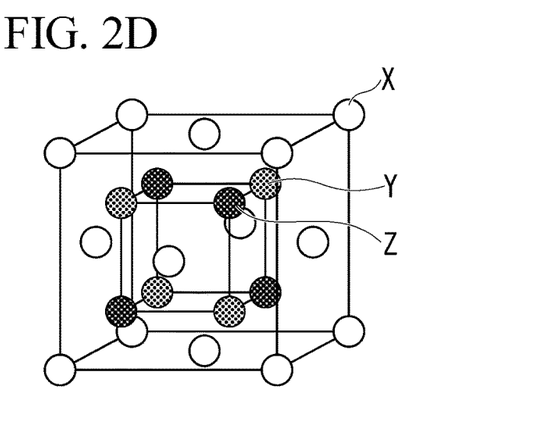
FIG. 2D is a diagram showing a crystal structure of a Heusler alloy.
Figure 2E:
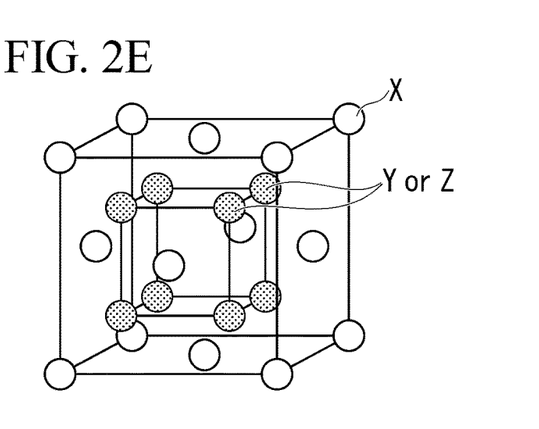
FIG. 2E is a diagram showing a crystal structure of a Heusler alloy.
Figure 2F:
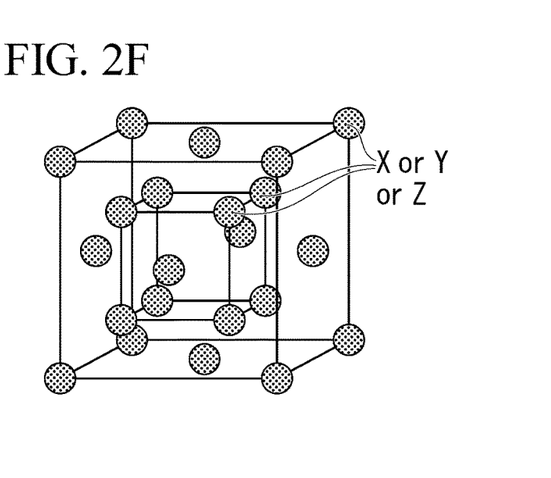
FIG. 2F is a diagram showing a crystal structure of a Heusler alloy.

FIGS. 2A to 2F are examples of crystal structures of Heusler alloys. FIGS. 2A, 2B, and 2C are examples of crystal structures of full Heusler alloys and FIGS. 2D, 2E, and 2F are examples of crystal structures of half Heusler alloys.

FIG. 2A is called an $L2_1$ structure. In the $L2_1$ structure, the element entering the X site, the element entering the Y site, and the element entering the Z site are fixed. FIG. 2B is called a B2 structure derived from the $L2_1$ structure. In the B2 structure, the element entering the Y site and the element entering the Z site are mixed, and the element entering the X site is fixed. FIG. 2C is called an A2 structure derived from the $L2_1$ structure. In the A2 structure, the element entering the X site, the element entering the Y site, and the element entering the Z site are mixed.

FIG. 2D is called a $C1_b$ structure. In the $C1_b$ structure, the element entering the X site, the element entering the Y site, and the element entering the Z site are fixed. FIG. 2E is called a B2 structure derived from the $C1_b$ structure. In the B2 structure, the element entering the Y site and the element entering the Z site are mixed and the element entering the X site is fixed. FIG. 2F is called an A2 structure derived from $C1_b$ structure. In the A2 structure, the element entering the X site, the element entering the Y site, and the element entering the Z site are mixed.

In the full Heusler alloy, the crystallinity is higher in the order of $L2_1$ structure>B2 structure>A2 structure, and in the half Heusler alloy, the crystallinity is higher in the order of $C1_b$ structure>B2 structure>A2 structure. These crystal structures differ in their crystallinity, but they are all crystals. The first ferromagnetic layer 1 has, for example, any of the above-described crystal structures. The crystal structure of the first ferromagnetic layer 1 is, for example, the $L2_1$ structure or the B2 structure.

Here, X is a Co, Fe, Ni, or Cu group transition metal element or noble metal element on the periodic table, Y is a Mn, V, Cr, or Ti group transition metal or X element type, and Z is a typical element of Groups III to V. If the Heusler alloy contains Co, X is Co.

The Heusler alloy containing Co is represented by, for example, $Co_2Y_\alpha Z_\beta$. Y is, for example, one or more elements selected from the group consisting Fe, Mn, and Cr, Z is, for example, one or more elements selected from the group consisting Si, Al, Ga, and Ge, and $\alpha+\beta>2$ is satisfied. Y is particularly preferably Fe and Z is particularly preferably Ga and Ge. For example, $\alpha$ satisfies $0.3<\alpha<2.1$ and more preferably satisfies $0.4<\alpha<2.0$. $\beta$ satisfies $0.1 \leq \beta \leq 2.0$.

A stoichiometric full Heusler alloy is represented by $Co_2YZ$. When $\alpha+\beta>2$ is satisfied, the Co composition ratio becomes relatively smaller than the sum of the composition ratios of the elements on the Y site and the Z site. When the Co composition ratio is relatively smaller than the sum of the composition ratios of the elements on the Y site and the Z site, it is possible to avoid the antisite in which the elements on the Y site and the Z site are substituted with the element (Co) on the X site. Antisite fluctuates the Fermi level in Heusler alloys. Fluctuations in the Fermi level reduce the half-metallicity of Heusler alloys and reduce the spin polarizability. A decrease in spin polarization causes a decrease in the MR ratio of the magnetoresistance effect element 10.

The Heusler alloy containing Co may be represented by, for example, $Co_2Fe_\alpha Ga_{\beta 1} Ge_{\beta 2}$. The composition formula may satisfy $\alpha+\beta 1+\beta 2 \geq 2.3, \alpha < \beta 1+\beta 2$, $0.5 < \alpha < 1.9$, $0.1 \leq \beta 1$, $0.1 \leq \beta 2$.

The full Heusler alloy containing Co is, for example, $Co_2FeSi$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, or the like. The half Heusler alloy containing Co is, for example, CoFeSb or CoMnSb.

The second ferromagnetic layer 2 may be a Heusler alloy or a ferromagnetic layer other than the Heusler alloy. When the second ferromagnetic layer 2 contains the Heusler alloy, the same material as that of the first ferromagnetic layer 1 can be used. When the second ferromagnetic layer 2 is the ferromagnetic layer other than the Heusler alloy, the second ferromagnetic layer 2 contains, for example, a metal selected from the group consisting of Cr, Mn, Co, Fe, and Ni, an alloy containing one or more of these metals, and an alloy containing these metals and at least one element of B, C and N. The second ferromagnetic layer 2 is, for example, Co—Fe and Co—Fe—B.

The non-magnetic layer 3 is sandwiched between the first ferromagnetic layer 1 and the second ferromagnetic layer 2. For example, the non-magnetic layer 3 has a thickness in the range of 1 nm or more and 10 nm or less. The non-magnetic layer 3 inhibits magnetic coupling between the first ferromagnetic layer 1 and the second ferromagnetic layer 2.

Figure 3:
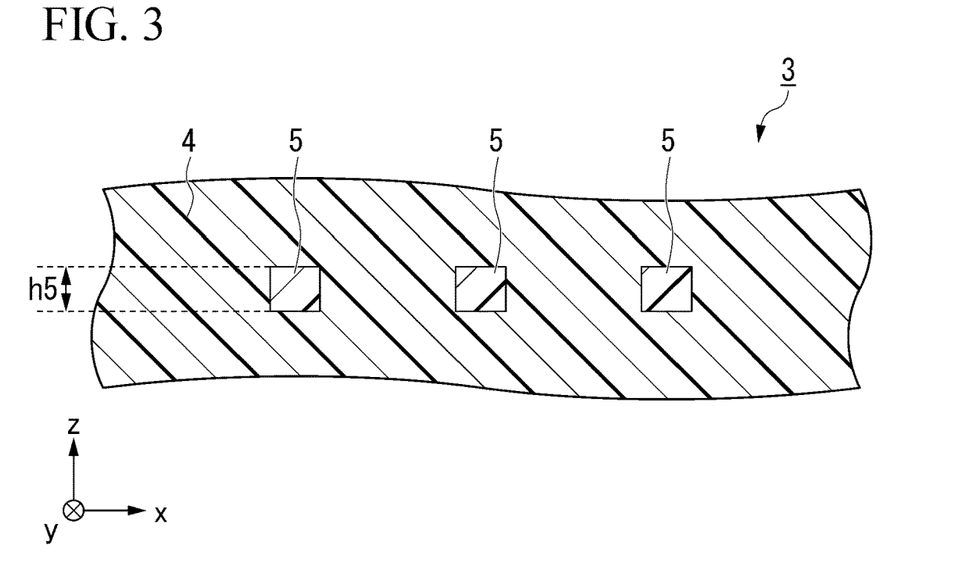
FIG. 3 is a cross-sectional view of a non-magnetic layer according to the first embodiment.
Figure 4:
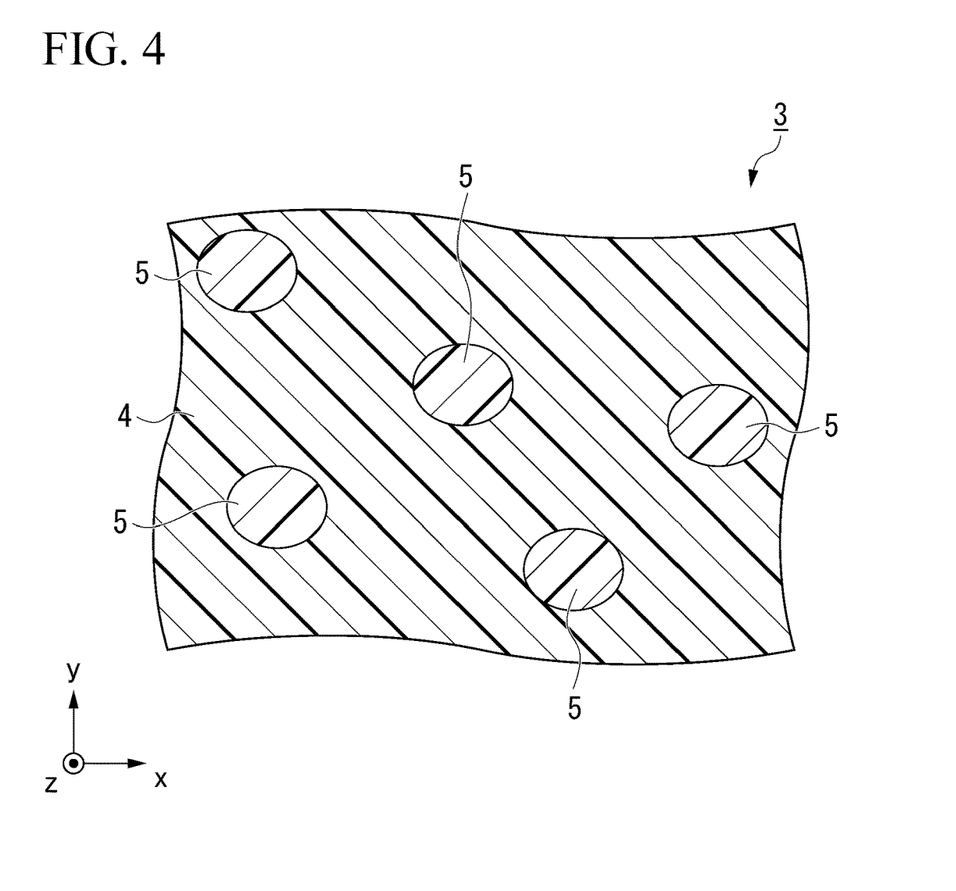
FIG. 4 is another cross-sectional view of the non-magnetic layer according to the first embodiment.

FIGS. 3 and 4 are cross-sectional views of the non-magnetic layer according to the first embodiment. FIG. 3 shows a cross-section in which the non-magnetic layer 3 is cut along the xz plane. FIG. 4 shows a cross-section in which the non-magnetic layer 3 is cut along the xy plane passing through the second non-magnetic region 5.

The non-magnetic layer 3 includes a first non-magnetic region 4 and a second non-magnetic region 5. A plurality of the second non-magnetic regions 5 exist in the non-magnetic layer 3. The second non-magnetic regions 5 are scattered in the non-magnetic layer 3.

Each of the second non-magnetic regions 5 is sandwiched between the first non-magnetic region 4 in the z direction. Each of the second non-magnetic regions 5 is surrounded by the first non-magnetic region 4.

The first non-magnetic region 4 contains, for example, a non-magnetic metal. The first non-magnetic region 4 is made of, for example, a non-magnetic metal. The first non-magnetic region 4 is, for example, a metal or alloy containing any element selected from the group consisting of Cu, Au, Ag, Al, and Cr. Metals or alloys containing these elements are excellent in electrical conductivity and reduce the area resistance (hereinafter, referred to as RA) of the magnetoresistance effect element 10.

The first non-magnetic region 4 contains, for example, any atom selected from the group consisting of Cu, Au, Ag, Al, and Cr as a main constituent atom. The main constituent atom means that the ratio of Cu, Au, Ag, Al, and Cr in the composition formula is 50% or more. The first non-magnetic region 4 preferably contains Ag, and preferably contains Ag as a main constituent atom. Since Ag has a long spin diffusion length, the magnetoresistance effect element 10 using Ag exhibits a large MR ratio. The first non-magnetic region 4 is, for example, Ag or AgSn.

The first non-magnetic region 4 may be an insulator or a semiconductor. Non-magnetic insulators are, for example, $Al_2O_3$, $SiO_2$, MgO, $MgAl_2O_4$, and materials in which a part of Al, Si, and Mg are replaced with Zn, Be, and the like. These materials have a large bandgap and excellent insulating properties. When the first non-magnetic region 4 is made of non-magnetic insulators, the non-magnetic layer 3 is a tunnel barrier layer. The non-magnetic semiconductors are, for example, Si, Ge, $CuInSe_2$, $CuGaSe_2$, $Cu(In, Ga)Se_2$, and the like.

The second non-magnetic region 5 contains a non-magnetic material. The atoms or molecules constituting each of the second non-magnetic regions 5 have a smaller atomic weight or molecular weight than the atoms or molecules constituting the first non-magnetic region 4. Here, the atoms or molecules constituting the region are the atoms or molecules that mainly constitute the region. For example, the atoms or molecules constituting the first non-magnetic region 4 are Ag or AgSn. Atoms or molecules with a small atomic weight or molecular weight tend to crystallize and are difficult to diffuse from the non-magnetic layer 3 to the first ferromagnetic layer 1 or the second ferromagnetic layer 2.

The second non-magnetic region 5 is, for example, metal oxide or metal nitride. The second non-magnetic region 5 is, for example, any oxide or nitride selected from the group consisting of Mo, Nb, Zr, Zn, Cr, V, Ti, Al, and Mg. The material constituting each of the second non-magnetic regions 5 may be the same or different.

Each crystal structure of the second non-magnetic region 5 is a NaCl type structure. The second non-magnetic region 5 serves as a nucleus for crystallization of the non-magnetic layer 3. When the non-magnetic layer 3 includes the second non-magnetic region 5, the crystallinity of the non-magnetic layer 3 is increased. Further, since the crystallization starts from the second non-magnetic region 5, the crystal structure of the non-magnetic layer 3 is controlled and the lattice matching between the non-magnetic layer 3 and the first ferromagnetic layer 1 or the second ferromagnetic layer 2 is increased.

For example, the melting point of the atoms or molecules constituting the second non-magnetic region 5 may be higher than the melting point of the atoms or molecules constituting the first non-magnetic region 4. If the atoms or molecules constituting the second non-magnetic region 5 have a high melting point, it becomes difficult for these atoms or molecules to diffuse from the non-magnetic layer 3 to the first ferromagnetic layer 1 or the second ferromagnetic layer 2.

The thickness of each second non-magnetic region 5 in the z direction is, for example, 1 nm or less. Further, as shown in FIG. 4, the ratio occupied by the second non-magnetic region 5 may be larger than 0% and smaller than 50% in a cross-section obtained by cutting the non-magnetic layer 3 in a layer passing through at least one of the second non-magnetic regions 5. The second non-magnetic region 5 may be less conductive than the first non-magnetic region 4. When the ratio of the second non-magnetic region 5 is within the above-described range, an increase in the resistance of the non-magnetic layer 3 can be suppressed.

Figure 5:
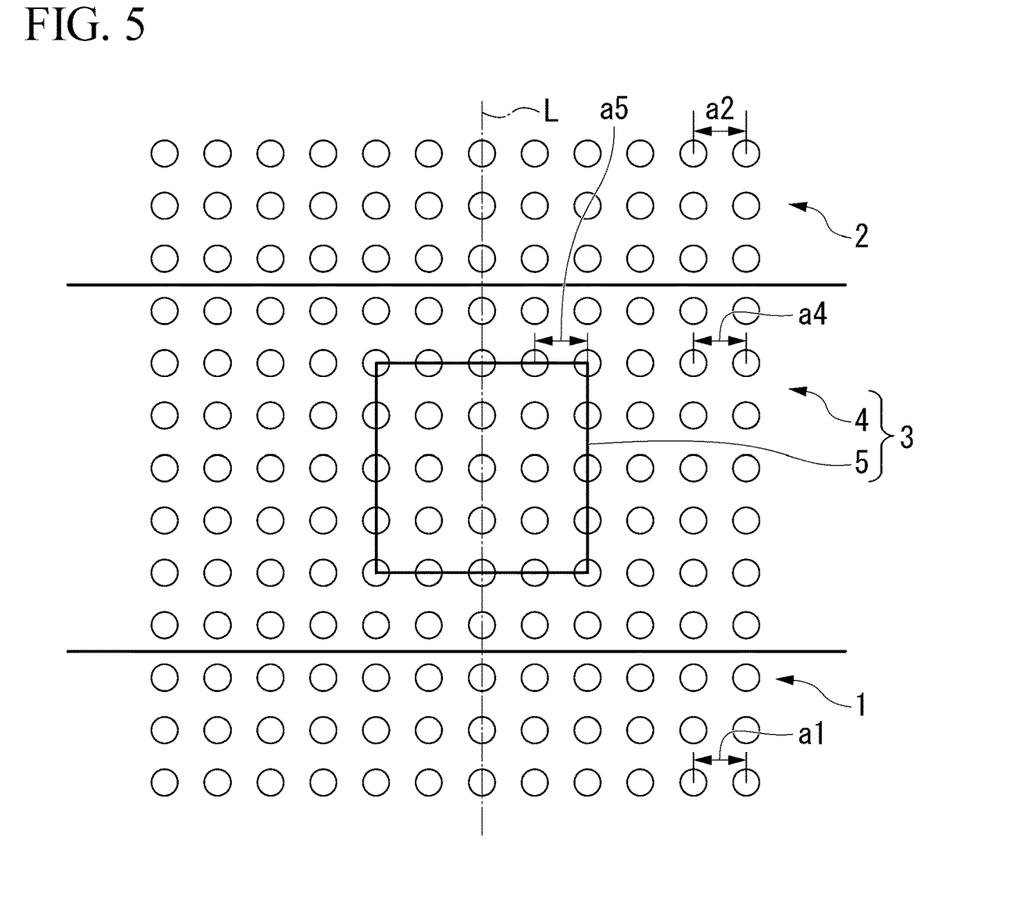
FIG. 5 is a conceptual diagram of the atomic arrangement of the magnetoresistance effect element according to the first embodiment.

FIG. 5 is a conceptual diagram of the atomic arrangement of the magnetoresistance effect element 10 according to the first embodiment. As shown in FIG. 5, at least a part of the second non-magnetic region 5 may be crystallized continuously with the first non-magnetic region 4 and the first ferromagnetic layer 1 or the second ferromagnetic layer 2. At least a part of the second non-magnetic region 5 may be crystallized continuously with the first non-magnetic region 4, the first ferromagnetic layer 1, and the second ferromagnetic layer 2.

Here, "continuous crystallization" can be confirmed by the continuous arrangement of atoms in a transmission electron microscope (TEM) image. When the first non-magnetic region 4, the second non-magnetic region 5, the first ferromagnetic layer 1, and the second ferromagnetic layer 2 are continuously crystallized, a line L in which the atoms are arranged in a line can be drawn by confirming the arrangement of atoms in order from the bottom layer as shown in FIG. 5.

For example, the lattice mismatching between the second non-magnetic region 5 and the first non-magnetic region 4 is smaller than 10%. The lattice mismatching at the interface is obtained by ("lattice constant a5 of second non-magnetic region 5"–"lattice constant a4 of first non-magnetic region 4")/"lattice constant a5 of second non-magnetic region 5".

Further, for example, the lattice mismatching between the first non-magnetic region 4 and the first ferromagnetic layer 1 is smaller than 10%. The lattice mismatching at the interface is obtained by ("lattice constant a4 of first non-magnetic region 4"–"lattice constant a1 of first ferromagnetic layer 1")/"lattice constant a1 of first ferromagnetic layer 1".

Further, for example, the lattice mismatching between the first non-magnetic region 4 and the second ferromagnetic layer 2 is smaller than 10%. The lattice mismatching at the interface is obtained by ("lattice constant a2 of the second ferromagnetic layer 2"–"lattice constant a4 of the first non-magnetic region 4")/"lattice constant a4 of the first non-magnetic region 4".

When the lattice mismatching at each interface is within the above-described range, each layer or region is continuously crystallized.

The composition of each layer can be determined using Energy Dispersive X-ray Spectroscopy (EDS). Further, for example, the composition distribution of each material in the film thickness direction can be confirmed by performing EDS line analysis.

The magnetoresistance effect element 10 may include layers other than the first ferromagnetic layer 1, the second ferromagnetic layer 2, and the non-magnetic layer 3. For example, an underlying layer may be provided below the first ferromagnetic layer 1 and a cap layer may be provided above the second ferromagnetic layer 2. The underlying layer and the cap layer increase the crystal orientation of the first ferromagnetic layer 1 and the second ferromagnetic layer 2. The underlying layer and the cap layer contain, for example, Ru, Ir, Ta, Ti, Al, Au, Ag, Pt, and Cu. In addition, as a layer for increasing the lattice matching, a NiAl layer may be provided between the first ferromagnetic layer 1 and the non-magnetic layer 3 or between the second ferromagnetic layer 2 and the non-magnetic layer 3.

Next, a method of manufacturing the magnetoresistance effect element 10 will be described. First, a substrate that serves as a base for film formation is prepared. The substrate may be crystalline or amorphous. Examples of crystalline substrates include metal oxide single crystals, silicon single crystals, and sapphire single crystals. Examples of amorphous substrates include silicon single crystal with a thermal oxide film, glass, ceramics, and quartz.

Next, an underlying layer is deposited on the substrate as needed. The underlying layer may be a laminated film of a plurality of layers. Next, the first ferromagnetic layer 1 is deposited on the underlying layer. Each layer is deposited by, for example, a sputtering method.

Next, the non-magnetic layer 3 is deposited on the first ferromagnetic layer 1. The non-magnetic layer 3 is formed in a first step, a second step, and a third step. In the first step, a part of the first non-magnetic region 4 is formed. In the second step, a material for the second non-magnetic region 5 is deposited on the first non-magnetic region 4 and flash annealing is performed using a laser. When flash annealing is performed, the material for the second non-magnetic regions 5 is crystallized, and the second non-magnetic regions 5 having the NaCl structure are formed. In the third step, the rest of the first non-magnetic region 4 is formed to cover the second non-magnetic region 5. The non-magnetic layer 3 can be deposited by a sputtering method.

Next, the second ferromagnetic layer 2 is deposited on the non-magnetic layer 3. The second ferromagnetic layer 2 can be deposited by a sputtering method. Finally, a cap layer is deposited on the second ferromagnetic layer.

Next, a laminate laminated on the substrate is annealed. The annealing temperature is, for example, 300° C. or lower, for example, 250° C. or higher and 300° C. or lower. Additionally, annealing may be performed after depositing the second ferromagnetic layer, that is, before depositing the cap layer.

When the laminate is annealed, crystallization of the first non-magnetic region 4, the first ferromagnetic layer 1, and the second ferromagnetic layer 2 starts from the crystallized second non-magnetic region 5. By using the crystallized second non-magnetic region 5 as a nucleus for crystal growth, the crystal structure of each layer and region can be controlled. As a result, the lattice matching at the interface between the first non-magnetic region 4, the second non-magnetic region 5, the first ferromagnetic layer 1, and the second ferromagnetic layer 2 is increased.

Here, although one of the methods of manufacturing the magnetoresistance effect element 10 has been introduced, the above-described method can also be applied to the method of crystallizing the ferromagnetic layer. For example, a crystalline Heusler alloy can be obtained by laminating a ferromagnetic layer containing a Heusler alloy on the non-magnetic layer 3 including the second non-magnetic region 5 and heating them.

In the method of manufacturing the magnetoresistance effect element 10 according to this embodiment, the first ferromagnetic layer 1 and the second ferromagnetic layer 2 are crystallized at a low temperature of 300° C. or lower. When the temperature is 300° C. or lower, adverse effects on other elements (for example, the magnetic shield) can be reduced, for example, even if annealing is performed after manufacturing other elements of the magnetic head. Therefore, the timing of annealing is not restricted, and the manufacture of elements such as magnetic heads is facilitated.

Further, in the magnetoresistance effect element 10 according to this embodiment, the crystallinity of the first ferromagnetic layer 1 and the second ferromagnetic layer 2 sandwiching the non-magnetic layer 3 is high since the second non-magnetic region 5 serves as a nucleus for crystal growth. Further, since the second non-magnetic region 5 serves as a nucleus for crystal growth, crystallization of each layer or region can be controlled and the lattice matching at each interface of the magnetoresistance effect element 10 can be increased. When the crystallinity of the first ferromagnetic layer 1 and the second ferromagnetic layer 2 increases, the spin polarization of the first ferromagnetic layer 1 and the second ferromagnetic layer 2 increases.

Moreover, when the lattice matching at each interface of the magnetoresistance effect element 10 is high, the scattering of spins is suppressed. Therefore, the magnetoresistance effect element 10 according to this embodiment exhibits a high MR ratio.

Further, since the second non-magnetic region 5 is located at the middle position of the non-magnetic layer 3 in the z direction, the crystallinity of both the first ferromagnetic layer 1 and the second ferromagnetic layer 2 can be improved and the lattice matching at the interface between the first ferromagnetic layer 1 and the non-magnetic layer 3 and the interface between the second ferromagnetic layer 2 and the non-magnetic layer 3 can be increased.

Although the first embodiment has been described in detail with reference to the drawings, each configuration and combination thereof are examples, and additions, omissions, substitutions, and other modifications of the configuration can be made without departing from the scope of the present disclosure.

Figure 6:
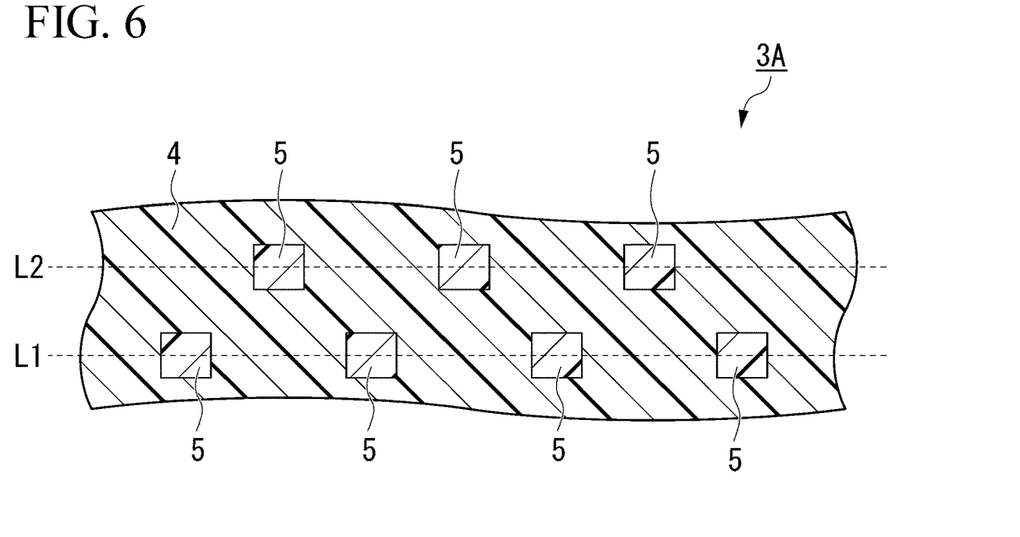
FIG. 6 is a cross-sectional view of a non-magnetic layer of a first modified example.

FIG. 6 is a cross-sectional view of a non-magnetic layer 3A according to a first modified example. A part of a second non-magnetic region 5 in the non-magnetic layer 3A is on a first layer L1 and a part of a second non-magnetic region is on a second layer L2. The first layer L1 and the second layer L2 are located at different positions in the z direction.

Since the second non-magnetic region 5 is on a different layer in the non-magnetic layer 3A, the crystallinity of the non-magnetic layer 3 can be further increased, and thus the crystallinity of a first ferromagnetic layer 1 and a second ferromagnetic layer 2 can be further increased.

The second non-magnetic region 5 on the first layer L1 and the second non-magnetic region 5 on the second layer L2 may be made of the same or different materials.

Figure 7:
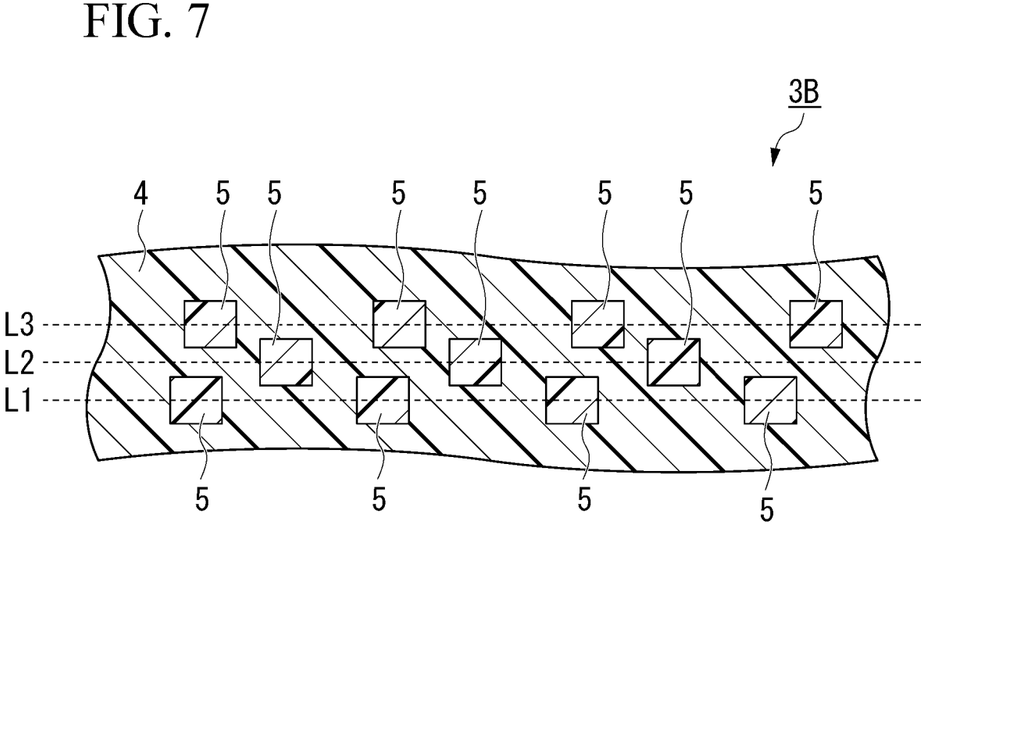
FIG. 7 is a cross-sectional view of a non-magnetic layer of a second modified example.

Further, FIG. 7 is a cross-sectional view of a non-magnetic layer 3B according to a second modified example. A second non-magnetic region 5 of the non-magnetic layer 3B is on a first layer L1, a second layer L2, and a third layer L3. As shown in FIG. 7, the number of layers where the second non-magnetic regions 5 exist may be three or more. Further, a part of the second non-magnetic region 5 belonging to a certain layer may overlap a part of the second non-magnetic region 5 belonging to another layer in the z direction.

Second Embodiment

Figure 8:
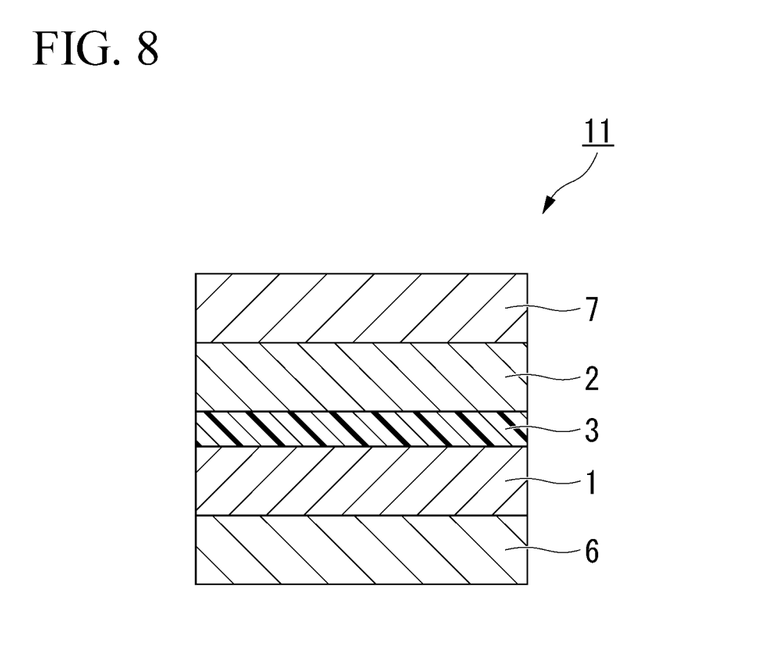
FIG. 8 is a cross-sectional view of a magnetoresistance effect element according to a second embodiment.

FIG. 8 is a cross-sectional view of a magnetoresistance effect element 11 according to a second embodiment. The magnetoresistance effect element 11 includes a first ferromagnetic layer 1, a second ferromagnetic layer 2, a non-magnetic layer 3, a third ferromagnetic layer 6, and a fourth ferromagnetic layer 7. The magnetoresistance effect element 11 is different from the magnetoresistance effect element 10 according to the first embodiment in that the third ferromagnetic layer 6 and the fourth ferromagnetic layer 7 are provided. In the magnetoresistance effect element 11 according to the second embodiment, configurations similar to those of the magnetoresistance effect element 10 according to the first embodiment are denoted by similar reference numerals, and description thereof is omitted.

The third ferromagnetic layer 6 and the non-magnetic layer 3 sandwich the first ferromagnetic layer 1. The third ferromagnetic layer 6 is in contact with the surface of the first ferromagnetic layer 1 opposite to the surface in contact with the non-magnetic layer 3.

The third ferromagnetic layer 6 contains, for example, an alloy containing at least one selected from the group consisting of Fe, Co, and Ni. The third ferromagnetic layer 6 is, for example, Co—Fe and Co—Fe—B.

At least a part of the second non-magnetic region 5 may be crystallized continuously with the first non-magnetic region 4, the first ferromagnetic layer 1, and the third ferromagnetic layer 6. In this case, when these layers are confirmed with a TEM, a line in which the atoms are aligned can be drawn if the arrangement of atoms is confirmed in order from the bottom layer.

For example, the lattice mismatching between the third ferromagnetic layer 6 and the first ferromagnetic layer 1 is smaller than, for example, 10%. The lattice mismatching at the interface is obtained by ("lattice constant a1 of first ferromagnetic layer 1"–"lattice constant of third ferromagnetic layer 6")/"lattice constant of third ferromagnetic layer 6". When the lattice mismatching at these interfaces is within the above-described range, each layer or region is continuously crystallized.

The fourth ferromagnetic layer 7 and the non-magnetic layer 3 sandwich the second ferromagnetic layer 2. The fourth ferromagnetic layer 7 is in contact with the surface of the second ferromagnetic layer 2 opposite to the surface in contact with the non-magnetic layer 3.

The fourth ferromagnetic layer 7 can use the same material as that of the third ferromagnetic layer 6. The material constituting the fourth ferromagnetic layer 7 may be the same as or different from the material constituting the third ferromagnetic layer 6.

At least a part of the second non-magnetic region 5 may be crystallized continuously with the first non-magnetic region 4, the second ferromagnetic layer 2, and the fourth ferromagnetic layer 7. In this case, when these layers are confirmed with a TEM, a line in which the atoms are aligned can be drawn if the arrangement of atoms is confirmed in order from the bottom layer.

For example, the lattice mismatching between the fourth ferromagnetic layer 7 and the second ferromagnetic layer 2 is smaller than, for example, 10%. The lattice mismatching at the interface is obtained by ("lattice constant a2 of second ferromagnetic layer 2"–"lattice constant of fourth ferromagnetic layer 7")/"lattice constant of fourth ferromagnetic layer 7". When the lattice mismatching of these interfaces is within the above-described range, each layer or region is continuously crystallized.

At least a part of the second non-magnetic region 5 may be crystallized continuously with the first non-magnetic region 4, the first ferromagnetic layer 1, the third ferromagnetic layer 6, the second ferromagnetic layer 2, and the fourth ferromagnetic layer 7. In this case, when these layers are confirmed with a TEM, a line in which the atoms are aligned can be drawn if the arrangement of atoms is confirmed in order from the bottom layer.

For example, the lattice mismatching between the third ferromagnetic layer 6 and the first ferromagnetic layer 1 is smaller than, for example, 10%. The lattice mismatching at the interface is obtained by ("lattice constant a1 of first ferromagnetic layer 1"–"lattice constant of third ferromagnetic layer 6")/"lattice constant of third ferromagnetic layer 6". For example, the lattice mismatching between the fourth ferromagnetic layer 7 and the second ferromagnetic layer 2 is smaller than, for example, 10%. The lattice mismatching at the interface is obtained by ("lattice constant a2 of second ferromagnetic layer 2"–"lattice constant of fourth ferromagnetic layer 7")/"lattice constant of fourth ferromagnetic layer 7". When the lattice mismatching of these interfaces is within the above-described range, each layer or region is continuously crystallized.

When the magnetoresistance effect element 11 includes the third ferromagnetic layer 6 and the fourth ferromagnetic layer 7, the MR ratio of the magnetoresistance effect element 11 increases. Here, although a case in which the magnetoresistance effect element 11 includes both the third ferromagnetic layer 6 and the fourth ferromagnetic layer 7 has been illustrated, the magnetoresistance effect element may include any one of the third ferromagnetic layer 6 and the fourth ferromagnetic layer 7.

Although the second embodiment has been described in detail with reference to the drawings as described above, each configuration and combination thereof are examples and addition, omission, replacement, and other modifications of the configuration can be made without departing from the scope of the present disclosure. For example, also in the second embodiment, the modified examples similar to those in the first embodiment can be applied.

The above-described magnetoresistance effect element 10 can be used for various applications. The magnetoresistance effect element 10 can be applied to, for example, magnetic heads, magnetic sensors, magnetic memories, high frequency filters, and the like.

Next, application examples of the magnetoresistance effect element according to this embodiment will be described. Additionally, in the following application examples, the magnetoresistance effect element 10 is used, but the magnetoresistance effect element is not limited thereto.

Figure 9:
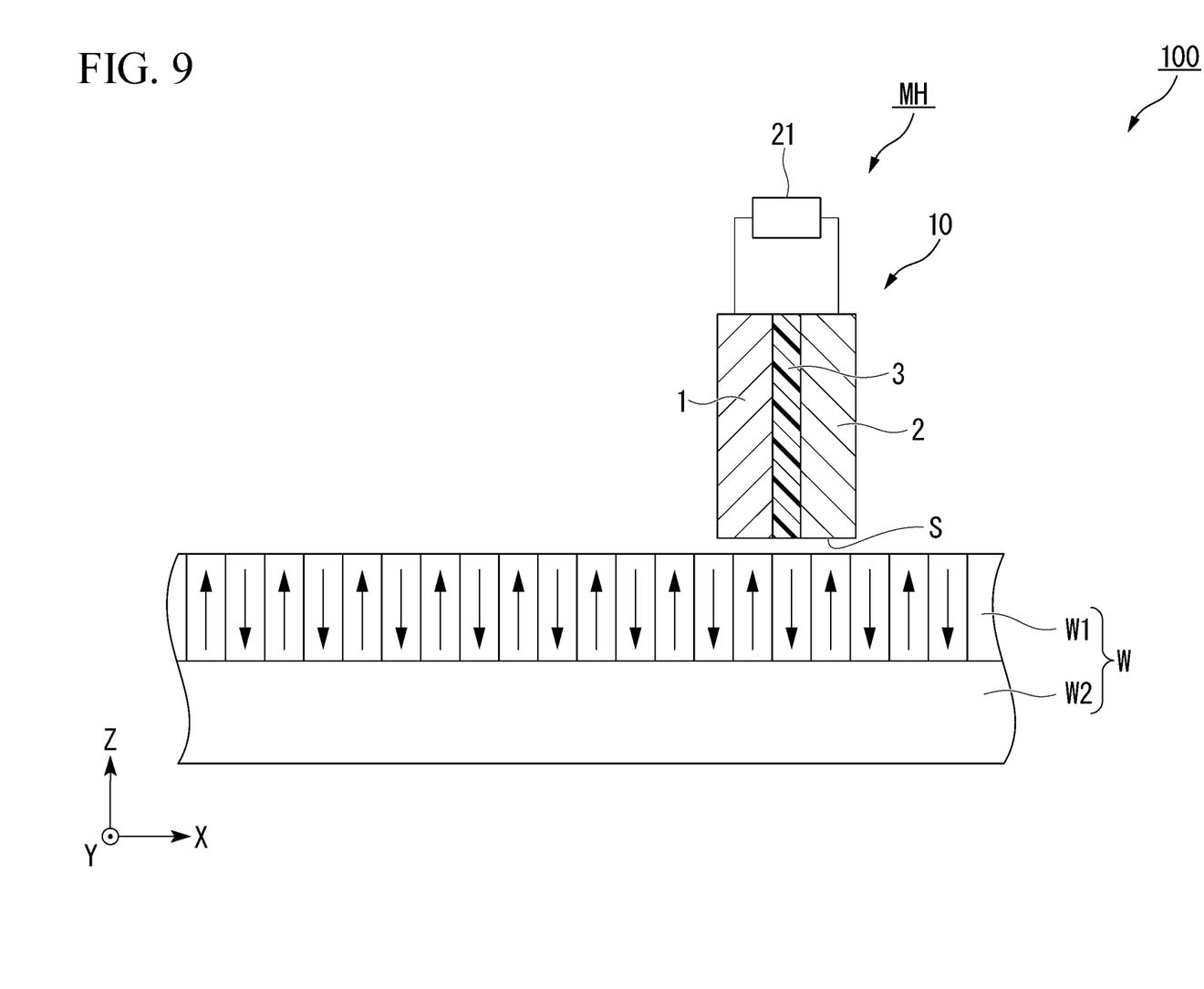
FIG. 9 is a cross-sectional view of a magnetic recording element according to Application Example 1.

FIG. 9 is a cross-sectional view of a magnetic recording element 100 according to Application Example 1. FIG. 9 is a cross-sectional view in which the magnetoresistance effect element 10 is cut along the laminating direction.

As shown in FIG. 9, the magnetic recording element 100 includes a magnetic head MH and a magnetic recording medium W. In FIG. 9, one direction in which the magnetic recording medium W extends is the X direction, and the direction perpendicular to the X direction is the Y direction. The XY plane is parallel to the main surface of the magnetic recording medium W. The direction connecting the magnetic recording medium W and the magnetic head MH and perpendicular to the XY plane is defined as the Z direction.

The magnetic head MH has an air bearing surface (air bearing surface: medium facing surface) S facing the surface of the magnetic recording medium W. The magnetic head MH moves along the surface of the magnetic recording medium W at a certain distance from the magnetic recording medium W in the directions of arrows+X and −X. The magnetic head MH includes the magnetoresistance effect element 10 serving as a magnetic sensor and a magnetic recording unit (not shown). The resistance measuring device 21 measures the resistance value of the magnetoresistance effect element 10 in the laminating direction.

The magnetic recording unit applies a magnetic field to a recording layer W1 of the magnetic recording medium W to determine the magnetization direction of the recording layer W1. That is, the magnetic recording unit performs magnetic recording of the magnetic recording medium W. The magnetoresistance effect element 10 reads magnetization information of the recording layer W1 written by the magnetic recording unit.

The magnetic recording medium W includes the recording layer W1 and a backing layer W2. The recording layer W1 is a portion for performing magnetic recording and the backing layer W2 is a magnetic path (path of magnetic flux) that circulates the magnetic flux for recording back to the magnetic head MH. The recording layer W1 records magnetic information in the magnetization direction.

The first ferromagnetic layer 1 of the magnetoresistance effect element 10 is, for example, a magnetization fixed layer, and the magnetization direction is fixed in the +Z direction. The second ferromagnetic layer 2 of the magnetoresistance effect element 10 is, for example, a magnetization free layer. Therefore, the second ferromagnetic layer 2 exposed on the air bearing surface S is affected by the magnetization recorded in the recording layer W1 of the facing magnetic recording medium W. For example, in FIG. 9, the magnetization direction of the second ferromagnetic layer 2 is oriented in the +Z direction under the influence of the +Z direction magnetization of the recording layer W1. In this case, the magnetization direction of the first ferromagnetic layer 1 which is the magnetization fixed layer is parallel to the magnetization direction of the second ferromagnetic layer 2.

Here, the resistance when the magnetization directions of the first ferromagnetic layer 1 and the second ferromagnetic layer 2 are parallel is different from the resistance when the magnetization directions of the first ferromagnetic layer 1 and the second ferromagnetic layer 2 are antiparallel. The MR ratio of the magnetoresistance effect element 10 increases as the difference between the resistance value in the parallel state and the resistance value in the antiparallel state increases. Since the magnetoresistance effect element 10 according to this embodiment contains a crystallized Heusler alloy and has high lattice matching between the layers, the MR ratio is large. Thus, the magnetization information of the recording layer W1 can be accurately read out as a resistance value change by the resistance measuring device 21.

The shape of the magnetoresistance effect element 10 of the magnetic head MH is not particularly limited. For example, the first ferromagnetic layer 1 may be installed at a position away from the magnetic recording medium W in order to avoid the influence of the leakage magnetic field of the magnetic recording medium W on the first ferromagnetic layer 1 of the magnetoresistance effect element 10.

Figure 10:
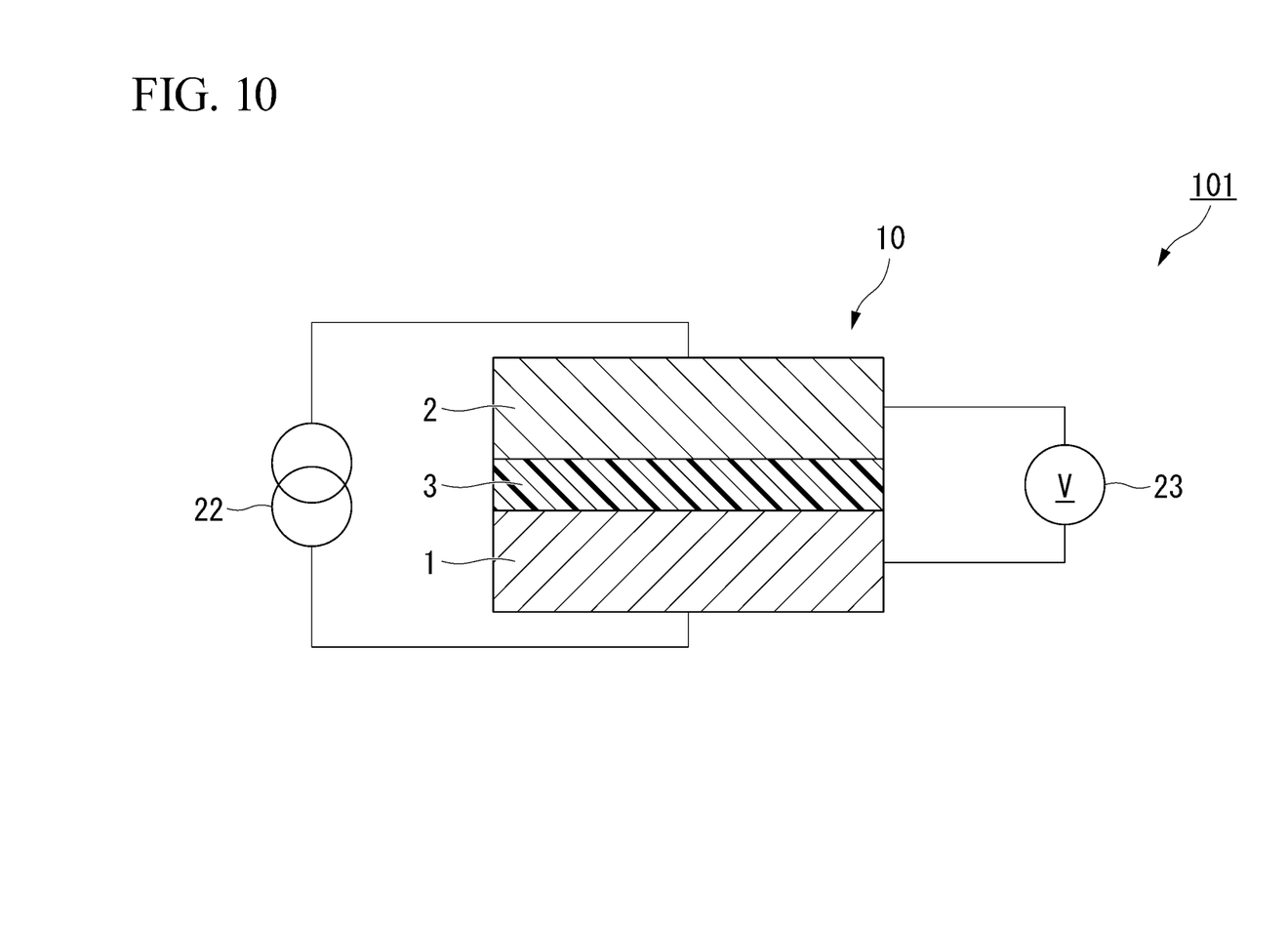
FIG. 10 is a cross-sectional view of a magnetic recording element according to Application Example 2.

FIG. 10 is a cross-sectional view of a magnetic recording element 101 according to Application Example 2. FIG. 10 is a cross-sectional view in which the magnetic recording element 101 is cut along the laminating direction.

As shown in FIG. 10, the magnetic recording element 101 includes a magnetoresistance effect element 10, a power supply 22, and a measurement unit 23. The power supply 22 applies a potential difference in the laminating direction of the magnetoresistance effect element 10. The power supply 22 is, for example, a DC power supply. The measurement unit 23 measures a resistance value of the magnetoresistance effect element 10 in the laminating direction.

When a potential difference is generated between the first ferromagnetic layer 1 and the second ferromagnetic layer 2 by the power supply 22, a current flows in the laminating direction of the magnetoresistance effect element 10. The current is spin-polarized when passing through the first ferromagnetic layer 1 and becomes a spin-polarized current. The spin-polarized current reaches the second ferromagnetic layer 2 through the non-magnetic layer 3. The magnetization of the second ferromagnetic layer 2 undergoes magnetization reversal when receiving a spin transfer torque (STT) due to a spin-polarized current. As the relative angle between the magnetization direction of the first ferromagnetic layer 1 and the magnetization direction of the second ferromagnetic layer 2 changes, the resistance value of the magnetoresistance effect element 10 in the laminating direction changes. A resistance value of the magnetoresistance effect element 10 in the laminating direction is read by the measurement unit 23. That is, the magnetic recording element 101 shown in FIG. 10 is a spin transfer torque (STT) type magnetic recording element.

Since the magnetic recording element 101 shown in FIG. 10 contains a crystallized Heusler alloy and has high lattice matching between the layers, the MR ratio is large. When the MR ratio of the magnetoresistance effect element 10 is large, data can be accurately recorded.

Figure 11:
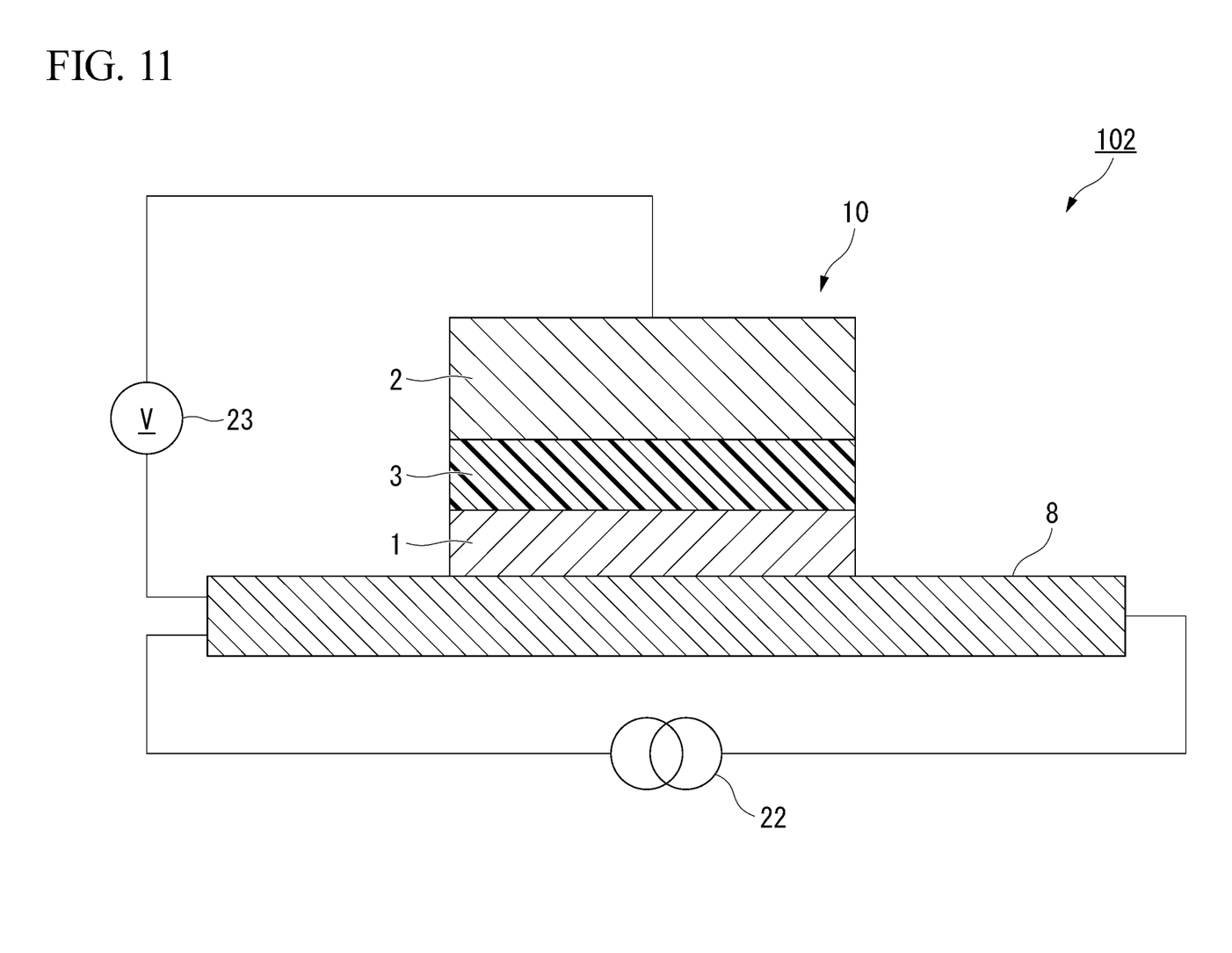
FIG. 11 is a cross-sectional view of a magnetic recording element according to Application Example 3.

FIG. 11 is a cross-sectional view of a magnetic recording element 102 according to Application Example 3. FIG. 11 is a cross-sectional view in which the magnetic recording element 102 is cut along the laminating direction.

As shown in FIG. 11, the magnetic recording element 102 includes a magnetoresistance effect element 10, a spin-orbit torque wiring 8, a power supply 22, and a measurement unit 23.

The spin-orbit torque wiring 8 is in contact with, for example, a first ferromagnetic layer 1. The spin-orbit torque wiring 8 extends in one direction of the in-plane direction. In Application Example 3, the first ferromagnetic layer 1 is a magnetization free layer and the second ferromagnetic layer 2 is a magnetization fixed layer.

The power supply 22 is connected to first and second ends of the spin-orbit torque wiring 8. The first end and the second end sandwich the magnetoresistance effect element 10 in the plan view. The power supply 22 applies a write current along the spin-orbit torque wiring 8. The measurement unit 23 measures a resistance value of the magnetoresistance effect element 10 in the laminating direction.

When a potential difference is generated between the first and the second ends of the spin-orbit torque wiring 8 by the power supply 22, a current flows in the in-plane direction of the spin-orbit torque wiring 8. The spin-orbit torque wiring 8 has a function of generating a spin current by the spin Hall effect when a current flows. The spin-orbit torque wiring 8 contains, for example, any one of metal, alloy, intermetallic compound, metal boride, metal carbide, metal silicide, and metal phosphide having a function of generating a spin current by the spin Hall effect when a current flows. For example, the wiring contains non-magnetic metal having an atomic number of 39 or higher with d-electrons or f-electrons in the outermost shell.

When a current flows in the in-plane direction of the spin-orbit torque wiring 8, the spin-Hall effect occurs due to the spin-orbit interaction. The spin Hall effect is a phenomenon in which moving spins are curve in a direction perpendicular to the current flow direction. The spin Hall effect produces uneven distribution of spins in the spin-orbit torque wiring 8 and induces a spin current in the thickness direction of the spin-orbit torque wiring 8. Spins are injected from the spin-orbit torque wiring 8 into the first ferromagnetic layer 1 by the spin current.

Spins injected into the first ferromagnetic layer 1 apply spin-orbit torque (SOT) to the magnetization of the first ferromagnetic layer 1. The first ferromagnetic layer 1 receives spin-orbit torque (SOT) and undergoes magnetization reversal. As the relative angle between the magnetization direction of the first ferromagnetic layer 1 and the magnetization direction of the second ferromagnetic layer 2 changes, a resistance value of the magnetoresistance effect element 10 in the laminating direction changes. A resistance value of the magnetoresistance effect element 10 in the laminating direction is read by the measurement unit 23. That is, the magnetic recording element 102 shown in FIG. 11 is a spin orbit torque (SOT) type magnetic recording element.

Since the magnetic recording element 102 shown in FIG. 11 has a crystallized Heusler alloy and has high lattice matching between the layers, the MR ratio is large. When the MR ratio of the magnetoresistance effect element 10 is large, data can be accurately recorded.

Figure 12:
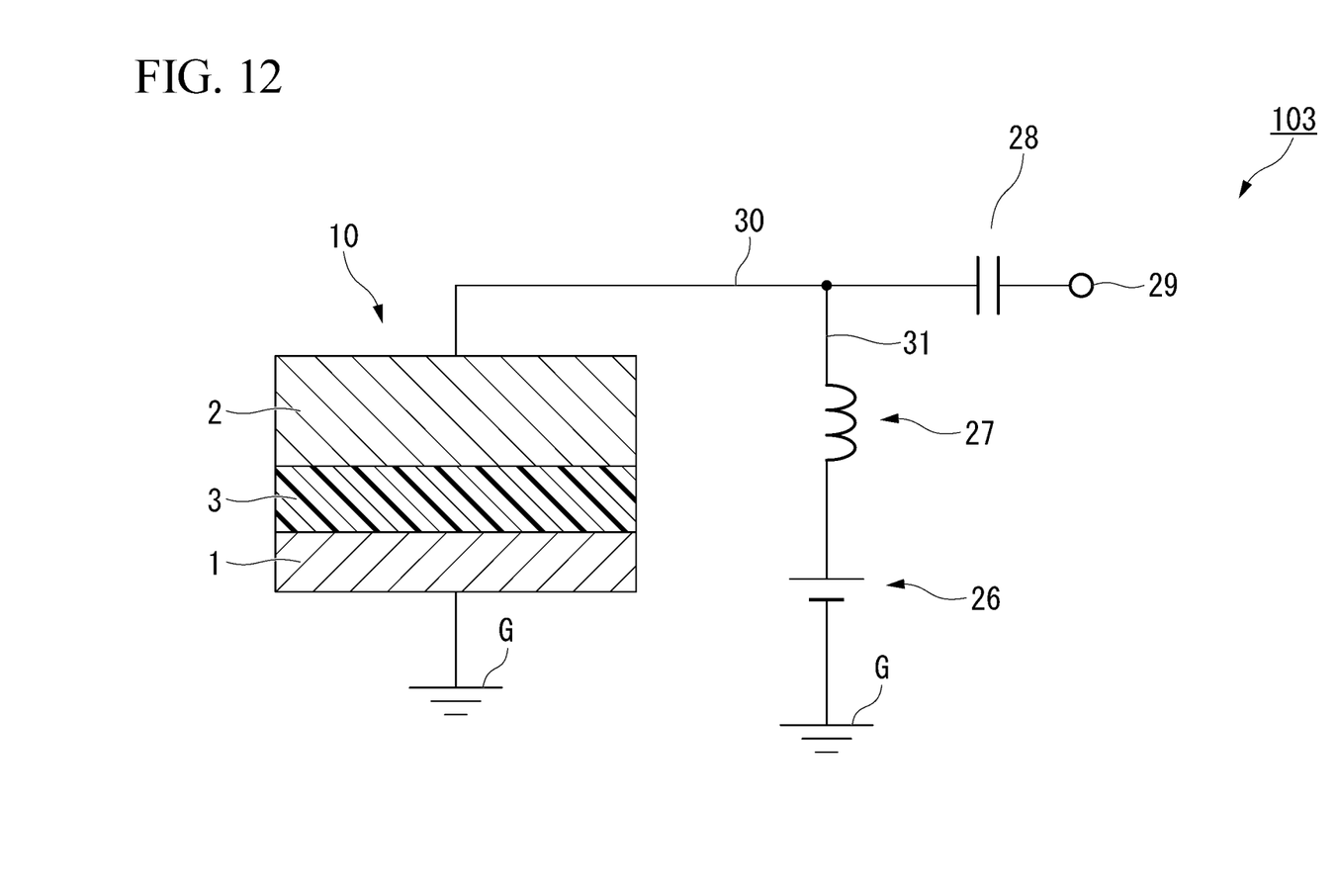
FIG. 12 is a cross-sectional view of a high-frequency device according to Application Example 4.

FIG. 12 is a schematic diagram of a high-frequency device 103 according to Application Example 4. As shown in FIG. 12, the high-frequency device 103 includes a magnetoresistance effect element 10, a DC power supply 26, an inductor 27, a capacitor 28, an output port 29, and wirings 30 and 31.

The wiring 30 connects the magnetoresistance effect element 10 to the output port 29. The wiring 31 branches from the wiring 30 and reaches a ground G via the inductor 27 and the DC power supply 26. Known ones can be used for the DC power supply 26, the inductor 27, and the capacitor 28. The inductor 27 cuts the high-frequency components of the current and passes the invariant component of the current. The capacitor 28 passes the high-frequency components of the current and cuts the invariant component of the current. The inductor 27 is disposed at a portion that requires the suppression of the flow of the high-frequency current and the capacitor 28 is disposed at a portion that requires the suppression of the flow of the DC current.

When an AC current or an AC magnetic field is applied to the ferromagnetic layer included in the magnetoresistance effect element 10, the magnetization of the second ferromagnetic layer 2 precesses. The magnetization of the second ferromagnetic layer 2 strongly oscillates when the frequency of the high-frequency current or high-frequency magnetic field applied to the second ferromagnetic layer 2 is near the ferromagnetic resonance frequency of the second ferromagnetic layer 2 and does not oscillate much at frequencies far from the ferromagnetic resonance frequency of the second ferromagnetic layer 2. This phenomenon is called a ferromagnetic resonance phenomenon.

The resistance value of the magnetoresistance effect element 10 changes due to oscillation of the magnetization of the second ferromagnetic layer 2. The DC power supply 26 applies a DC current to the magnetoresistance effect element 10. The DC current flows in the laminating direction of the magnetoresistance effect element 10. The DC current flows to the ground G via the wirings 30 and 31 and the magnetoresistance effect element 10. The potential of the magnetoresistance effect element 10 changes according to Ohm's law. A high-frequency signal is output from the output port 29 according to a change in potential (a change in resistance value) of the magnetoresistance effect element 10.

Since the high-frequency device 103 shown in FIG. 12 includes the magnetoresistance effect element 10 that contains a crystallized Heusler alloy and has a wide variation in resistance value, a high-output and high-frequency signal can be transmitted.

EXAMPLE

Example 1

The magnetoresistance effect element 10 shown in FIG. 1 was manufactured as Example 1. First, Cr and Ag were formed in order as underlying layers on a silicon substrate. Next, the first ferromagnetic layer 1 was deposited on the underlying layer. At this point, the first ferromagnetic layer 1 was amorphous. The first ferromagnetic layer 1 is a Heusler alloy represented by $Co_2Fe_{0.9}Ga_{0.5}Ge_{0.9}$. The thickness of the first ferromagnetic layer 1 was 6 nm.

Next, the non-magnetic layer 3 was deposited on the first ferromagnetic layer 1. The non-magnetic layer 3 has Ag as the first non-magnetic region and MgO as the second non-magnetic region. The non-magnetic layer 3 was deposited by the following procedure. After depositing Ag with a thickness of 2 nm, MgO was deposited with a thickness of 0.5 nm. Then, the surface was flash annealed to form the second non-magnetic region. The second non-magnetic regions were scattered on the deposition surface. Next, Ag was deposited with a thickness of 2 nm again on the deposition surface.

Next, the second ferromagnetic layer 2 was deposited on the non-magnetic layer 3. The second ferromagnetic layer 2 is a Heusler alloy represented by $Co_2Fe_{0.9}Ga_{0.5}Ge_{0.9}$. The thickness of the second ferromagnetic layer 2 was 4 nm.

Next, Ta was deposited as a cap layer on the second ferromagnetic layer 2. Then the laminate was annealed. Annealing was performed at 270° C. for 5 hours. The annealing crystallized the first ferromagnetic layer 1 and the second ferromagnetic layer 2.

The MR ratio of the manufactured magnetoresistance effect element 10 was measured. For the MR ratio, a change in the resistance value of the magnetoresistance effect element 10 was measured by monitoring a voltage applied to the magnetoresistance effect element 10 using a voltmeter while sweeping a magnetic field to the magnetoresistance effect element 10 from the outside in a state in which a constant current flowed in the laminating direction of the magnetoresistance effect element. The resistance value when the magnetization directions of the first ferromagnetic layer 1 and the second ferromagnetic layer 2 were parallel and the resistance value when the magnetization directions of the first ferromagnetic layer 1 and the second ferromagnetic layer 2 were antiparallel were measured and the MR ratio was calculated by the following formula from the obtained resistance values. The MR ratio was measured at 300K (room temperature).

$$MR\ ratio\ (\%) = (R_{AP} - R_P)/R_P \times 100$$

$R_P$ is the resistance value when the magnetization directions of the first ferromagnetic layer 1 and the second ferromagnetic layer 2 are parallel, and $R_{AP}$ is the resistance value when the magnetization directions of the first ferromagnetic layer 1 and the second ferromagnetic layer 2 are antiparallel.

The MR ratio of the magnetoresistance effect element 10 according to Example 1 was 15.3%.

Comparative Example 1

Comparative Example 1 is different from Example 1 in that the second non-magnetic region 5 is not formed. A non-magnetic layer 3 was manufactured by depositing Ag to a thickness of 4.5 nm. The MR ratio of a magnetoresistance effect element 10 according to Comparative Example 1 was 7.2%.

The MR ratio of Example 1 was higher than the MR ratio of Comparative Example 1. This is probably because the non-magnetic layer 3 having the second non-magnetic region 5 increases the lattice matching at the interface between the respective layers and regions.

EXPLANATION OF REFERENCES

1 First ferromagnetic layer
2 Second ferromagnetic layer
3, 3A, 3B Non-magnetic layer
4 First non-magnetic region
5 Second non-magnetic region
6 Third ferromagnetic layer
7 Fourth ferromagnetic layer
8 Spin-orbit torque wiring
10, 11 Magnetoresistance effect element
21 Resistance measuring device
22 Power supply
23 Measurement unit
26 DC power supply
27 Inductor
28 Capacitor
29 Output port
30, 31 Wiring
100, 101, 102 Magnetic recording element
103 High-frequency device

What is claimed is:

1. A magnetoresistance effect element comprising:
a first ferromagnetic layer;
a second ferromagnetic layer; and
a non-magnetic layer,
wherein the non-magnetic layer is between the first ferromagnetic layer and the second ferromagnetic layer,
wherein the first ferromagnetic layer contains at least partially crystallized Heusler alloy containing Co,
wherein the non-magnetic layer has a first non-magnetic region and a second non-magnetic region,
wherein each of the second non-magnetic region is sandwiched between the first non-magnetic regions in a thickness direction of the non-magnetic layer,
wherein atoms or molecules constituting each of the second non-magnetic regions have a smaller atomic weight or molecular weight than atoms or molecules constituting the first non-magnetic region,
wherein each crystal structure of the second non-magnetic region is a NaCl type structure, and
wherein at least a part of the second non-magnetic region is crystallized continuously with the first non-magnetic region and the first ferromagnetic layer or the second ferromagnetic layer.

2. The magnetoresistance effect element according to claim 1,
wherein the second non-magnetic regions are scattered in the non-magnetic layer.

3. The magnetoresistance effect element according to claim 1,
wherein each of the second non-magnetic regions has a thickness of 1 nm or less in the thickness direction.

4. The magnetoresistance effect element according to claim 1,
wherein a part of the second non-magnetic region is on a first layer in the non-magnetic layer in the thickness direction, and
wherein a part of the second non-magnetic region is on a second layer different from the first layer in the thickness direction.

5. The magnetoresistance effect element according to claim 4,
wherein the second non-magnetic region on the first layer and the second non-magnetic region on the second layer are made of different materials.

6. The magnetoresistance effect element according to claim 1,
wherein a melting point of atoms or molecules constituting the second non-magnetic region is higher than a melting point of atoms or molecules constituting the first non-magnetic region.

7. The magnetoresistance effect element according to claim 1,
wherein the second non-magnetic region is metal oxide or metal nitride.

8. The magnetoresistance effect element according to claim 7,
wherein the second non-magnetic region is any oxide or nitride selected from the group consisting of Mo, Nb, Zr, Zn, Cr, V, Ti, Al, and Mg.

9. The magnetoresistance effect element according to claim 1, further comprising:
a third ferromagnetic layer,
wherein the third ferromagnetic layer and the non-magnetic layer sandwich the first ferromagnetic layer, and
wherein the third ferromagnetic layer contains an alloy containing at least one selected from the group consisting of Fe, Co, and Ni.

10. The magnetoresistance effect element according to claim 1, further comprising:
a fourth ferromagnetic layer,
wherein the fourth ferromagnetic layer and the non-magnetic layer sandwich the second ferromagnetic layer, and
wherein the fourth ferromagnetic layer contains an alloy containing at least one selected from the group consisting of Fe, Co, and Ni.

11. The magnetoresistance effect element according to claim 9, further comprising:
a fourth ferromagnetic layer,
wherein the fourth ferromagnetic layer and the non-magnetic layer sandwich the second ferromagnetic layer, and
wherein the fourth ferromagnetic layer contains an alloy containing at least one selected from the group consisting of Fe, Co, and Ni.

12. The magnetoresistance effect element according to claim 9,
wherein at least a part of the second non-magnetic region is crystallized continuously with the first non-magnetic region, the first ferromagnetic layer, and the third ferromagnetic layer.

13. The magnetoresistance effect element according to claim 10,
wherein at least a part of the second non-magnetic region is crystallized continuously with the first non-magnetic region, the second ferromagnetic layer, and the fourth ferromagnetic layer.

14. The magnetoresistance effect element according to claim 9, further comprising:
a fourth ferromagnetic layer,
wherein the fourth ferromagnetic layer and the non-magnetic layer sandwich the second ferromagnetic layer,
wherein the fourth ferromagnetic layer contains an alloy containing at least one selected from the group consisting of Fe, Co, and Ni, and
wherein at least a part of the second non-magnetic region is crystallized continuously with the first non-magnetic region, the first ferromagnetic layer, the third ferromagnetic layer, the second ferromagnetic layer, and the fourth ferromagnetic layer.

15. The magnetoresistance effect element according to claim 1,
wherein a ratio occupied by the second non-magnetic region is larger than 0% and smaller than 50% in a cross-section obtained by cutting the non-magnetic layer in a layer passing through at least one of the second non-magnetic regions.

* * * * *